United States Patent
Mochizuki

(10) Patent No.: US 10,243,566 B2
(45) Date of Patent: Mar. 26, 2019

(54) LADDER PROGRAM RETRIEVAL DEVICE CAPABLE OF RETRIEVING LADDER CIRCUITS BASED ON SPECIFIED SIGNAL OPERATION CONDITIONS

(71) Applicant: FANUC Corporation, Yamanashi (JP)

(72) Inventor: Mitsuru Mochizuki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 408 days.

(21) Appl. No.: 14/973,792

(22) Filed: Dec. 18, 2015

(65) Prior Publication Data
US 2016/0179904 A1 Jun. 23, 2016

(30) Foreign Application Priority Data
Dec. 19, 2014 (JP) ................................. 2014-257497

(51) Int. Cl.
*G06F 17/30* (2006.01)
*H03K 19/177* (2006.01)

(52) U.S. Cl.
CPC .............................. *H03K 19/17764* (2013.01)

(58) Field of Classification Search
CPC ........ G06F 17/30542; H03K 19/17764; G05B 19/056; G05B 2219/13004
USPC .................................. 707/722, 780; 700/86
See application file for complete search history.

(56) References Cited

U.S. PATENT DOCUMENTS

| 5,267,145 A * | 11/1993 | Zifferer | G05B 19/058 700/86 |
| 5,299,114 A * | 3/1994 | Onishi | G05B 19/056 700/18 |
| 2015/0094829 A1* | 4/2015 | Iwatsu | G05B 19/056 700/86 |
| 2016/0004242 A1* | 1/2016 | Yamaoka | G05B 19/056 700/87 |

(Continued)

FOREIGN PATENT DOCUMENTS

| JP | S62-86408 A | 4/1987 |
| JP | 2003-84813 A | 3/2003 |
| JP | 2004-005060 A | 1/2004 |

(Continued)

OTHER PUBLICATIONS

Office Action in JP application No. 2014-257497, dated Mar. 14, 2017.

*Primary Examiner* — Hosain T Alam
*Assistant Examiner* — Robert F May
(74) *Attorney, Agent, or Firm* — Hauptman Ham, LLP

(57) ABSTRACT

Provided is a ladder program retrieval device that includes: search condition specification unit for specifying, as search conditions, a plurality of signals and a logical operation relationship between any two signals included in the plurality of signals; search signal presence determination unit for determining, for each of the plurality of ladder circuits included in the ladder program, whether the ladder circuit includes all of the plurality of signals specified in the search conditions; and search logic presence determination unit for determining, for each of the ladder circuits determined by the search signal presence determination unit to include all of the signals specified in the search conditions, whether or not the ladder circuit includes the logical operation relationship.

4 Claims, 13 Drawing Sheets

(56) References Cited

U.S. PATENT DOCUMENTS

2016/0034259 A1* 2/2016 Yamaoka .................. G06F 8/36
717/107

FOREIGN PATENT DOCUMENTS

JP 4245811 B2 4/2009
JP 2011-28562 A 2/2011

* cited by examiner

FIG.8A

STEP 2-1   JUNCTIONS ALIGNED DIRECTLY IN SERIES TO OTHER JUNCTIONS AND/OR PARTIAL CIRCUITS ARE SUBSTITUTED WITH CONNECTING LINES

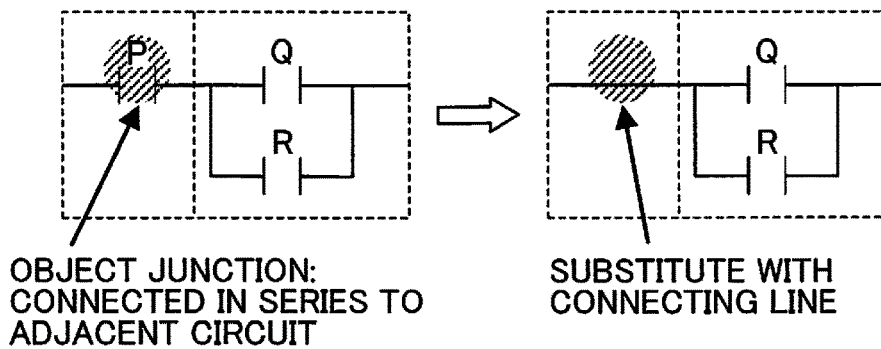

OBJECT JUNCTION: CONNECTED IN SERIES TO ADJACENT CIRCUIT

SUBSTITUTE WITH CONNECTING LINE

FIG.8B

STEP 2-2   JUNCTIONS ALIGNED DIRECTLY IN PARALLEL WITH ANOTHER JUNCTION OR PARTIAL CIRCUIT ARE DELETED

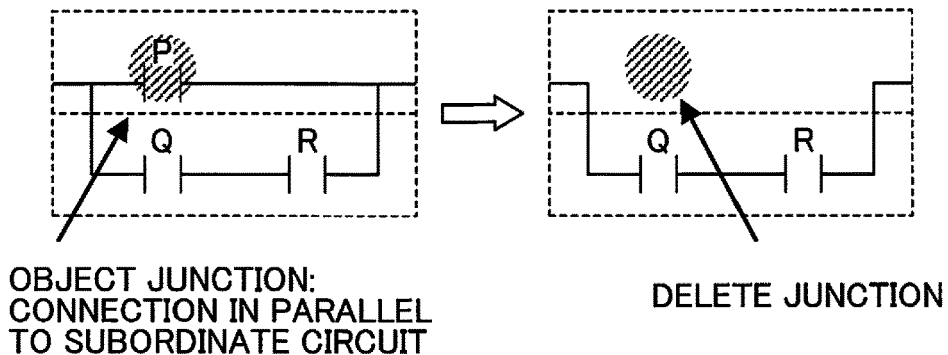

OBJECT JUNCTION: CONNECTION IN PARALLEL TO SUBORDINATE CIRCUIT

DELETE JUNCTION

FIG.8C

STEP 2-3   DELETE WRITE COIL

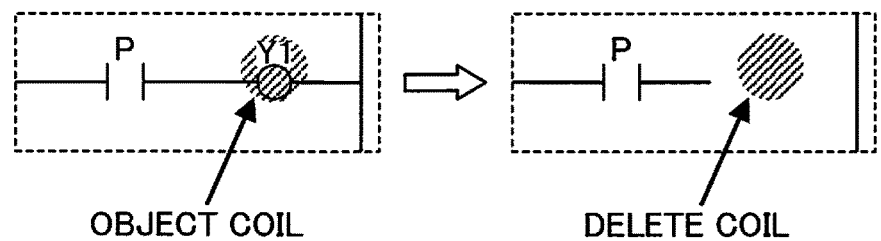

OBJECT COIL

DELETE COIL

FIG.10
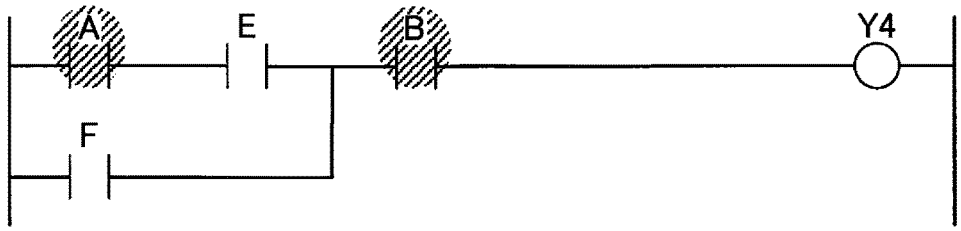
⇩ STEP 2-1 APPLIED TO JUNCTION E; SUBSTITUTED WITH CONNECTING LINE
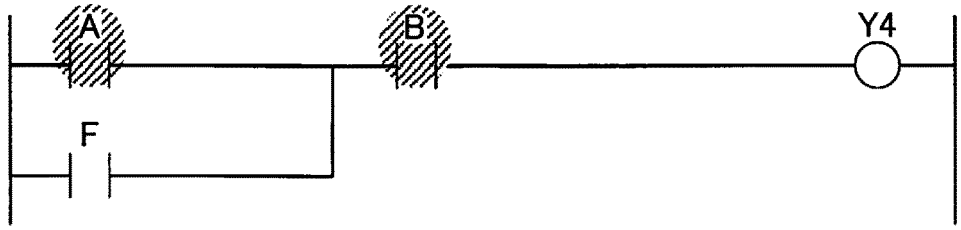
⇩ STEP 2-2 APPLIED TO JUNCTION F; DELETED
⇩ STEP 2-3 APPLIED TO COIL Y4; DELETED
⇩ SHAPE LADDER CIRCUIT

FIG.11
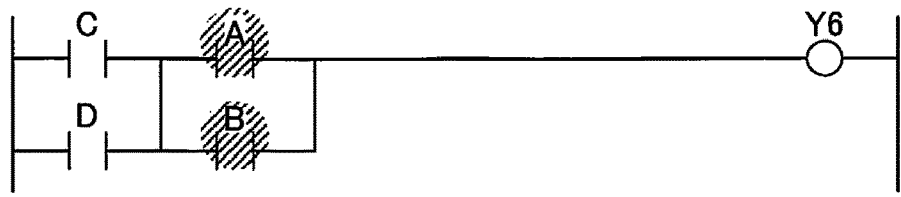
⇩ STEP 2-2 APPLIED TO JUNCTION C; DELETED
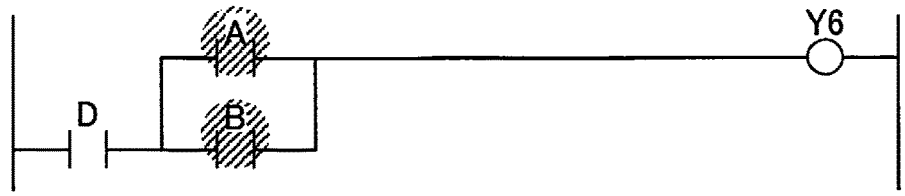
⇩ STEP 2-1 APPLIED TO JUNCTION D;
SUBSTITUTE WITH CONNECTING LINE
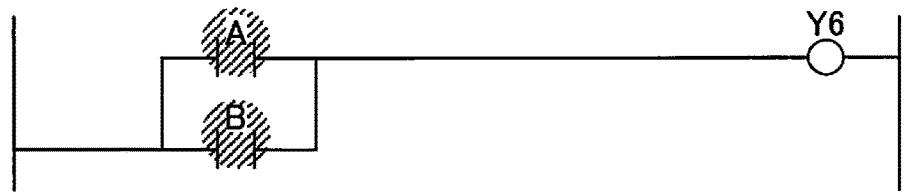
⇩ STEP 2-3 APPLIED TO COIL Y6; DELETED
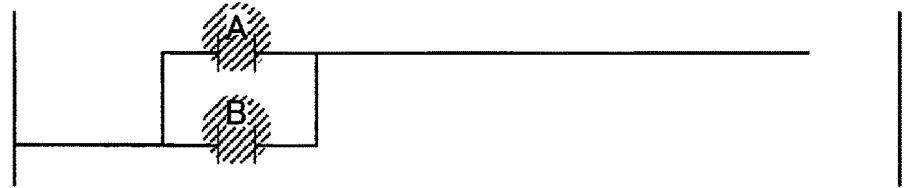
⇩ SHAPE LADDER CIRCUIT

FIG.12
⇩ CONVERT TO CALCULATION TREE
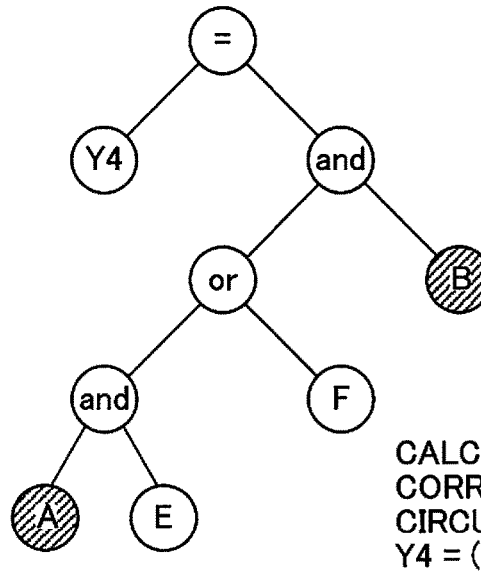
CALCULATION FORMULA CORRESPONDING TO CIRCUIT ABOVE:
Y4 = ((A and E) or F) and B
FIG.13
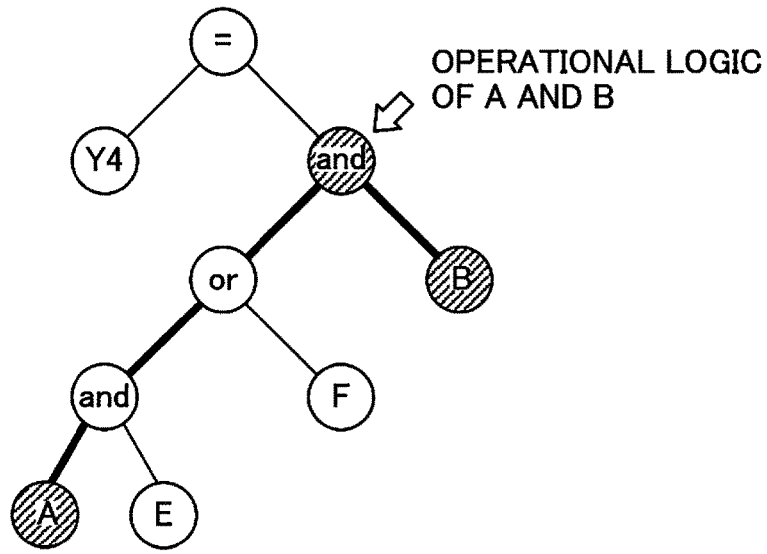
OPERATIONAL LOGIC OF A AND B

LADDER PROGRAM RETRIEVAL DEVICE CAPABLE OF RETRIEVING LADDER CIRCUITS BASED ON SPECIFIED SIGNAL OPERATION CONDITIONS

RELATED APPLICATIONS

The present application claims priority to Japanese Application Number 2014- 257497, filed Dec. 19, 2014, the disclosure of which is hereby incorporated by reference herein in its entirety.

BACKGROUND OF THE INVENTION

1. Field of the Invention

The present invention relates to a ladder program retrieval device, and in particular to a ladder program retrieval device capable of retrieving a ladder circuit based on the operation conditions of specified signals.

2. Description of the Related Art

When creating a ladder program, verifying operation (debugging) and diagnosing abnormalities or the like during operation, associated ladder circuits are frequently called up onto a screen from a ladder program. Therefore, in many cases, functions for retrieving and extracting ladder circuits by setting, as a search condition, a signal and/or command used by the target ladder circuit are provided.

In general, when searching for a particular ladder circuit among a ladder program, a signal used by that ladder circuit is specified and the target ladder circuit is extracted by retrieving ladder circuits which include that signal. In general, the signal in the search condition is indicated by a text character string indicating a name (identifier), an address or the like assigned to that signal, and the search result is reported to an operator by calling up, onto a screen, the first ladder circuit that is determined to match the condition, or by displaying a list of all of the ladder circuits that are determined to match the condition.

For example, if a signal "A" is specified as a search condition in a ladder program editing device, and retrieval of ladder circuits is instructed on the basis of this search condition, then as in the search result 1 shown in FIG. 14, all of the ladder circuits in which the signal "A" appears are displayed as a list on the screen. When a retrieval method of this kind is used, as the ladder program becomes larger in scale, then a larger number of ladder circuits will match the same condition.

In this way, when multiple ladder circuits are listed on the display, it becomes more difficult to extract the target circuit, and ultimately, the operator is often required to visually check all of the ladder circuits that are displayed. However, when a large number of ladder circuits is displayed as a list of search results, it takes time to locate the target ladder circuit at a glance, and there is a high risk of the occurrence of errors, such as overlooking the circuit, or the like.

Therefore, a technique has been proposed conventionally wherein, by making it possible to set further detailed conditions in addition to the search condition, the number of ladder circuits determined to be matching is reduced and a target ladder circuit can be identified more accurately. For example, Japanese Patent Application Publication No. 2004-005060 discloses a control program retrieval device wherein a combination of commands and variables (signals) can be specified as search conditions. Furthermore, Japanese Patent Application Publication No. 62-086408 discloses a programmable controller wherein a sequence of commands and signals can be specified as search conditions. Moreover, Japanese Patent No. 4245811 discloses a ladder circuit editing device wherein search conditions can be specified by the ladder diagram pattern.

However, the problems indicated below occur when technology such as that disclosed in Japanese Patent Application No. 2004-005060, Japanese Patent Application No. 62-086408 or JP 4245811 is introduced. More specifically, in the case of ladder circuits, even circuits which have equivalent logic may differ in terms of the sequence of operation commands and/or signals, and since a junction which represents supplementary conditions may be inserted therein, then there is a risk of overlooking a ladder circuit that should be determined to be a match, if the matching is determined simply by a comparison of command sequences and/or ladder diagram patterns.

SUMMARY OF THE INVENTION

Therefore, it is an object of the present invention to provide a ladder program retrieval device which is capable of retrieving/extracting a target ladder circuit efficiently, when retrieving/extracting a ladder circuit from a ladder program which is executed by a programmable controller.

The ladder program retrieval device according the present invention is a ladder program retrieval device which retrieves a plurality of ladder circuits included in a ladder program on the basis of specified search conditions, the device comprising: search condition specification unit for specifying, as search conditions, at least two plurality of signals, and at least one logical operation relationship between any two signals included in the plurality of signals; search signal presence determination unit for determining, for each of the plurality of ladder circuits included in the ladder program, whether the ladder circuit includes all of the plurality of signals specified in the search conditions; search logic presence determination unit for determining, for each of the ladder circuits determined by the search signal presence determination unit to include all of the signals specified in the search conditions, whether or not the ladder circuit includes the logical operation relationship; and display unit for displaying the ladder circuits determined to have matched the search conditions by the search signal presence determination unit and the search logic presence determination unit; wherein the search logic presence determination unit is provided with determination unit for determining a connection relationship in the ladder circuit between the signals included in the logical operation relationship, and determines whether or not the ladder circuit includes the logical operation relationship on the basis of the determination result of the determination unit.

The determination unit can be configured to generate a simplified ladder circuit by deleting, from the ladder circuit, signals other than the signals included in the logical operation relationship, and to determine a connection relationship in the ladder circuit between the signals included in the logical operation relationship, on the basis of the simplified ladder circuit.

The determination unit can be configured to generate a calculation tree from the ladder circuit, and determines the connection relationship in the ladder circuit between the signals included in the logical operation relationship on the basis of the calculation tree.

The ladder program retrieval device, may further comprise: a search mode retrieval unit for selecting a fuzzy search mode; wherein, when the fuzzy search mode is selected by the search mode retrieval unit, the search logic presence determination unit makes a determination such that a signal included in the logical operation relationship matches both a signal to which negative logic is not applied and a signal to which negative logic is applied.

By providing the configuration described above, the present invention makes it possible to extract a target ladder circuit more accurately, and is able to increase the efficiency of tasks such as the creation and diagnosis of ladders, by adding the logical relationship between signals as a search condition for ladder circuits, rather than just the signals used. Furthermore, in the present invention, since matching with conditions is determined on the basis of a logical operation linking two signals, rather than command sequences and/or ladder diameter patterns, then it is possible to determine a match even in the case of ladder circuits which have the same logical structure but different circuit forms due to reference to other signals, and therefore omissions in the retrieved circuits can be prevented.

BRIEF DESCRIPTION OF THE DRAWINGS

The abovementioned and further objects and characteristic features of the present invention will become evident from the following description of the embodiments with reference to the drawings, in which:

FIGS. 8A, 8B and 8C are diagrams for describing a ladder circuit simplification process according to an embodiment of the present invention;

FIG. 10 is a diagram showing a first determination example of a signal connection relationship using ladder circuit simplification according to an embodiment of the present invention;

FIG. 11 is a diagram showing a second determination example of a signal connection relationship using ladder circuit simplification according to an embodiment of the present invention;

FIG. 12 is a diagram showing an example in which a calculation tree is generated from a ladder circuit according to an embodiment of the present invention;

FIG. 13 is a diagram for describing a method for determining a signal connection relationship using a calculation tree according to an embodiment of the present invention;

DESCRIPTION OF THE PREFERRED EMBODIMENTS

Firstly, a technical overview of the present invention will be described.

Figure 14:
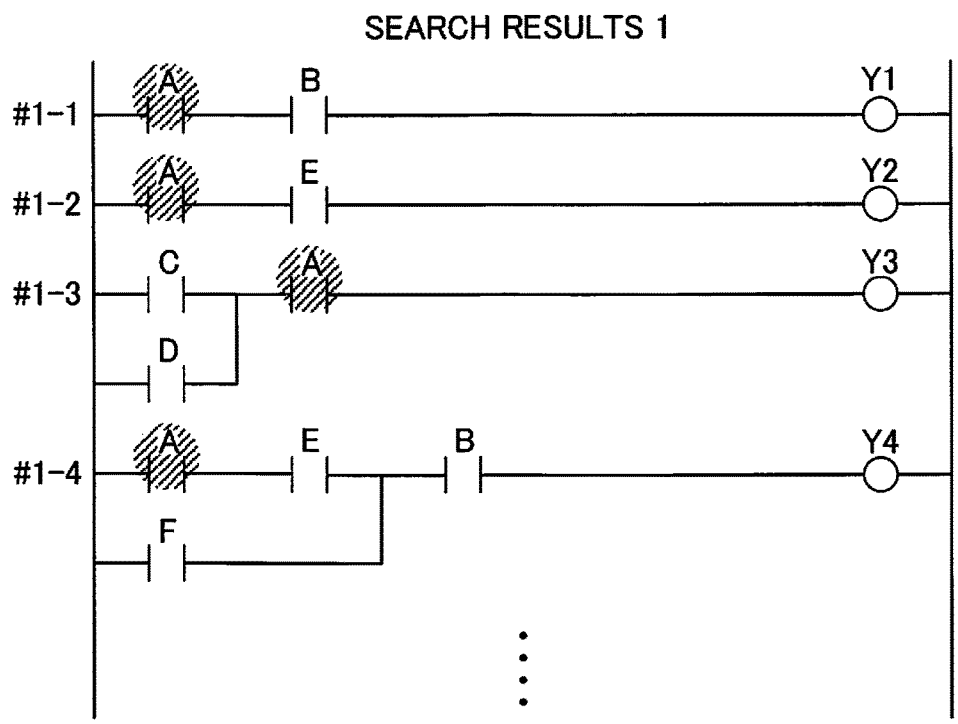
FIG. 14 is a diagram showing an example of retrieval of a ladder program based on a signal according to the prior art.
Figure 15:
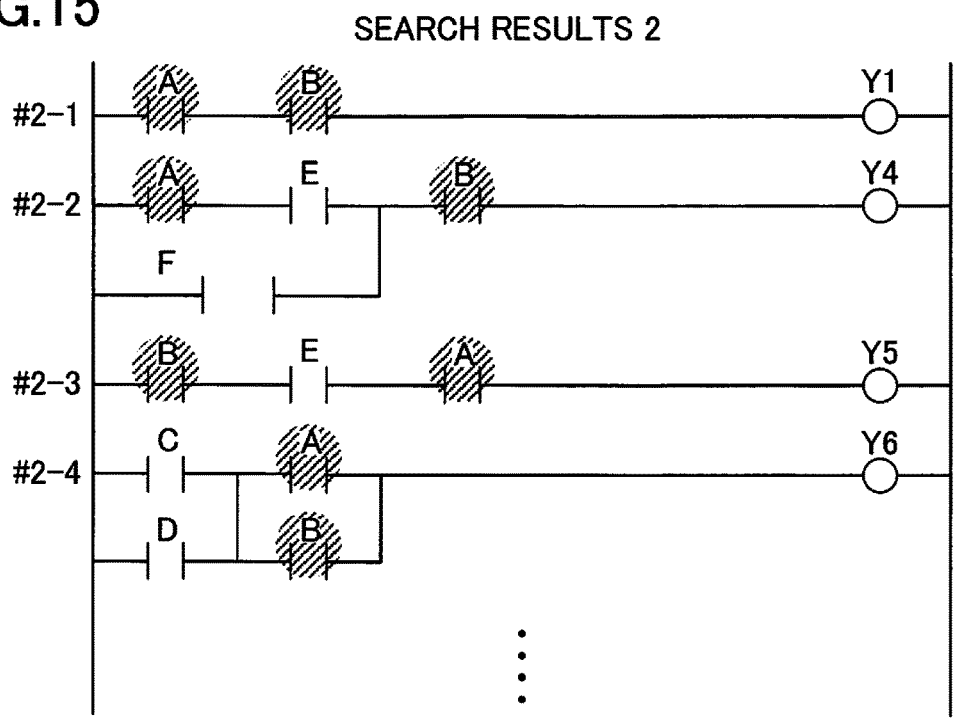
FIG. 15 is a diagram showing an example of retrieval of a ladder program based on two signals according to the prior art.

FIG. 15 shows a search result 2 for the same search object as in FIG. 14, but adding signal B to the search conditions, as well as signal A. In search result 2, the ladder circuits #1-2 and #1-3 which are displayed in the search result 1 in FIG. 14 do not include signal B, and therefore do not appear in the search result list.

Here, when consideration is given to further narrowing down the search result 2 shown in FIG. 15, then if the target circuit includes a signal apart from signal A and signal B, it would be possible to narrow down the result by simply adding this signal to the search conditions, but in practice, it is often the case that there is no signal suitable for narrowing down the results.

In the present invention, in order to enable the search results to be narrowed down further in addition to the foregoing, a logical operation relationship is introduced into the search conditions. For example, here, consideration is given to a case of retrieving a circuit of which the basic condition for operation (the condition for switching on a coil) is that both signal A and signal B are ON. Since the circuit operates when both of the signals are ON, then the ladder circuit is liable to include a logical operation which is a logical conjunction (and) for signal A and signal B. Therefore, "A and B" is set as a search condition. In general, it is possible to specify a plurality of logical operations as a search condition of this kind.

By adding the following functions to a ladder program retrieval device, the present invention provides retrieval means for obtaining more accurate search results in which the logical operation relationship is introduced.

[Means 1] A function for specifying a plurality of signals as a search condition

[Means 2] A function for specifying one or more logical operation relationship for any two signals of the signals specified in the search results (for example, "A and B", "A or B" "A and (not B)", etc. for signals A and B).

[Means 3] A function for determining whether the signals specified in the search conditions are all included, in each of the ladder circuits included in the ladder program.

[Means 4] A function for determining whether a logical operation relationship between two signals appears in a ladder circuit which has been determined to include all of the signals specified in the search conditions.

[Means 5] A function for displaying, on a screen, a ladder circuit which has been determined to match the search conditions by the two determination means described above.

Figure 1:
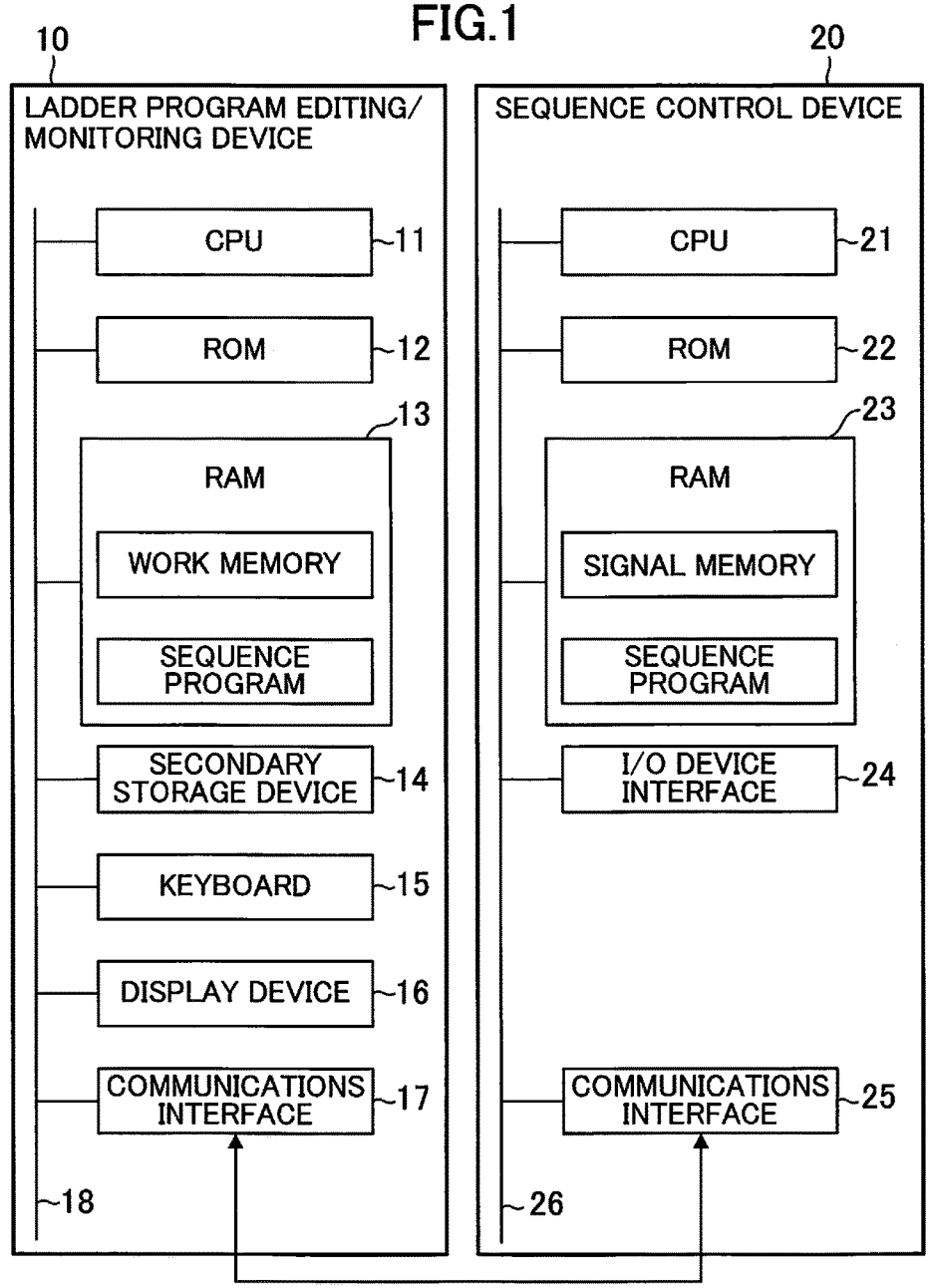
FIG. 1 is a principal block diagram of a ladder program retrieval device according to one embodiment of the present invention.

FIG. 1 is a principal block diagram of a ladder program retrieval device 10 according to one embodiment of the present invention. The ladder program retrieval device 10 according to the present embodiment is a ladder program editing device or monitor device, etc., which is equipped with the ladder program retrieval function proposed in the present invention.

The CPU 11 provided in the ladder program retrieval device 10 is a processor which provides overall control of the ladder program retrieval device 10, and reads out a system program stored in the ROM 12 via the bus 18, and controls the ladder program retrieval device 10 in accordance with the system program. The RAM 13 is provided with a work memory area for storing temporary calculation data and/or display data to be displayed on a display device 16, and various data input via a keyboard 15, etc. and an area for storing a sequence program, such as a ladder program which is the object of retrieval and editing.

A secondary storage device 14 is composed by a non-volatile storage device, such as a hard disk device, a memory card, or USB memory, and/or a non-volatile memory with battery back-up, and stores sequence programs, such as ladder programs handled by the ladder program retrieval device 10, and setting files, parameter files, and various other types of files.

The ladder program retrieval device 10 is connected to a sequence control device 20 via a communications interface 17, and sends sequence programs, such as ladder programs which are edited by operations performed by an operator at the ladder program retrieval device 10, to the sequence control device 20 via the communications interface 17. The sequence control device 20 carries out sequence control by receiving a sequence program via a communications interface 25, storing the program in a region for storing sequence programs provided on the RAM 23, and executing the stored sequence program by the CPU 21. The remainder of the configuration of the sequence control device 20 is omitted from the following description.

In the ladder program retrieval device 10, the ladder program retrieval process described below is executed on the basis of an operation performed by the operator. This process is achieved by means of the CPU 11 executing a ladder program retrieval process program which is included in a system program stored in the ROM 12.

Figure 2:
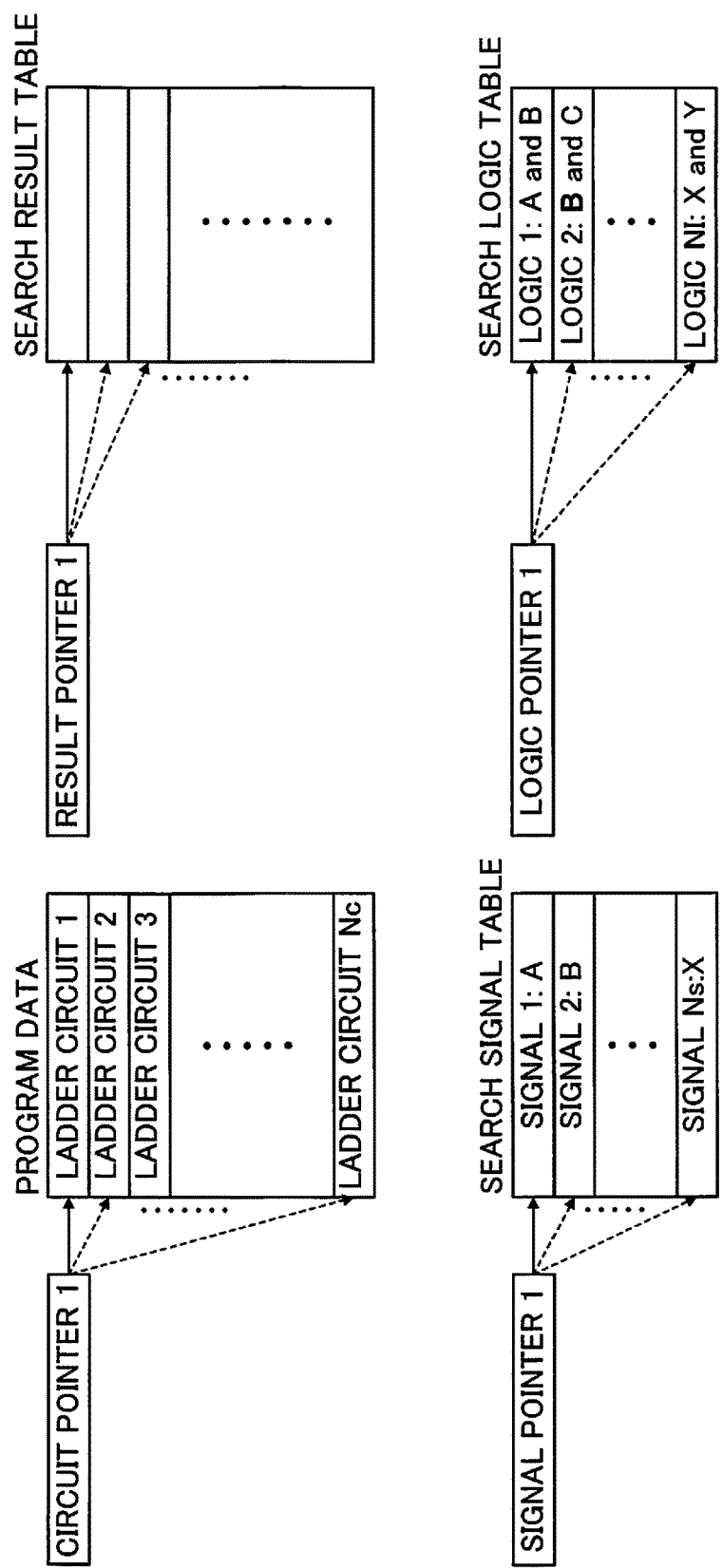
FIG. 2 is a diagram showing the structure of data used in the ladder program retrieval device according to an embodiment of the present invention.

Various data shown in FIG. 2, which is used in the ladder program retrieval process, is stored in the RAM 13 of the ladder program retrieval device 10.

The "program data" is a set of data in which ladder circuit data is arranged in a ladder program which is a search object. A "circuit pointer" is used in order to indicate a position of a ladder circuit in the program data.

A list of signals which are search conditions input by an operator is stored in a "search signal table". A "signal pointer" is used in order to indicate a position of a signal in the search signal table.

A list of logical operations which are search conditions input by an operator is stored in a "search logic table". A "logic pointer" is used in order to indicate a position of a logical operation in the search logic table.

A "search result table" is used to store position information of ladder circuits which have been determined to be a match as a result of carrying out the ladder program retrieval process. A "result pointer" is used in order to indicate a position of information in the search result table.

Figure 3:
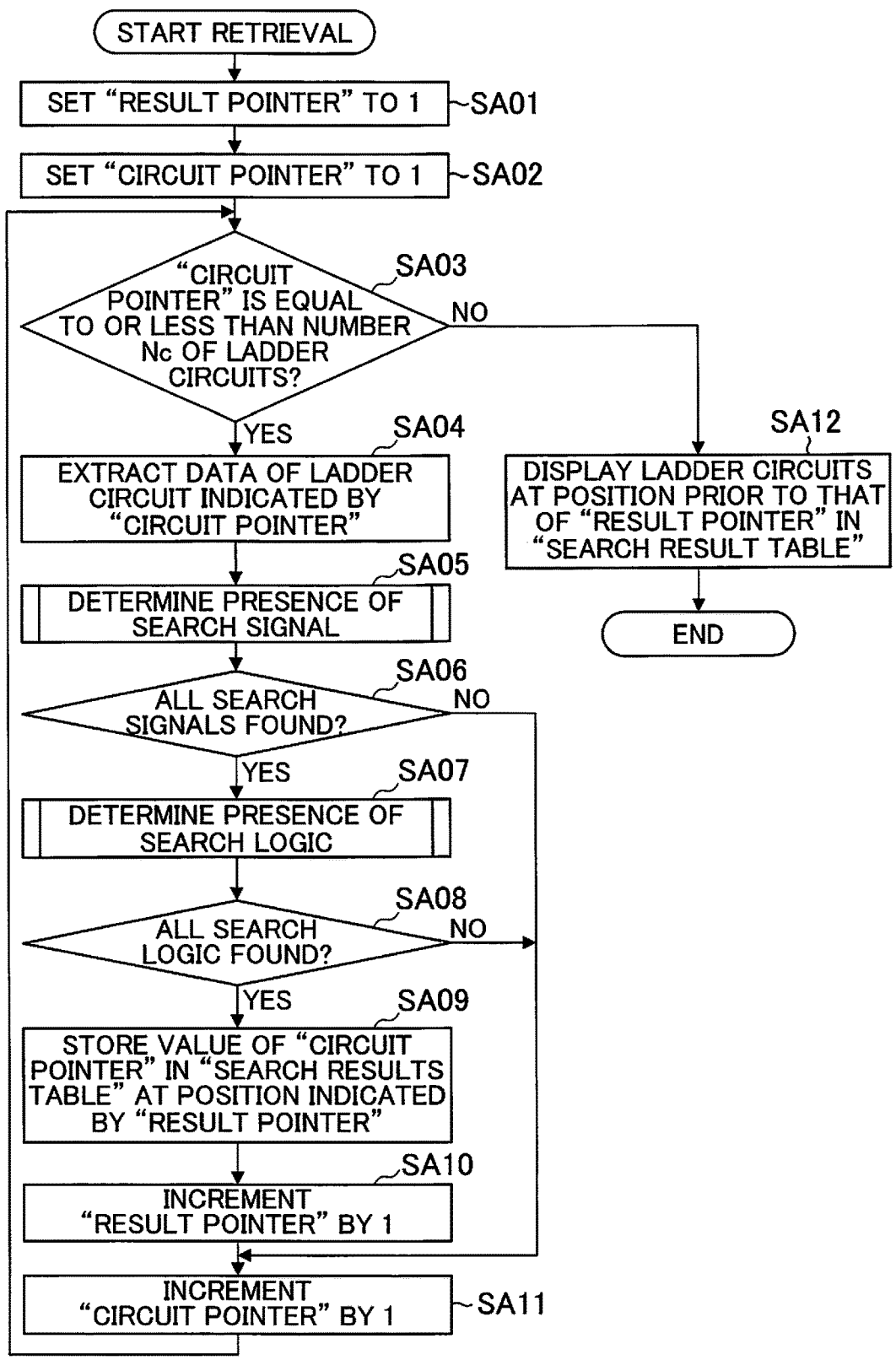
FIG. 3 is a general flowchart of processing executed in the ladder program retrieval device according to an embodiment of the present invention.

FIG. 3 shows a general flowchart of a ladder program retrieval process which is carried out by using the various data.

[Step SA01] The search pointer is set to 1.
[Step SA02] The circuit pointer is set to 1.
[Step SA03] It is determined whether there is remaining ladder circuit data that is a search object, in other words, whether or not the circuit pointer is equal to or less than the number Nc of the ladder circuits which are search objects. If the circuit pointer is equal to or less than Nc, then the procedure advances to step SA04, and if not, then the procedure advances to step SA12.

[Step SA04] Ladder circuit data is acquired from the position indicated by the circuit pointer in the program data.
[Step SA05] A search signal presence determination process, which is described below, is executed in respect of the ladder circuit data extracted in step SA04, and a search is made to identify whether the ladder circuit includes all of the signals which are search objects.
[Step SA06] It is determined whether or not the ladder circuit includes all of the signals that are the search objects, in the search signal presence determination process executed in step SA05. If the circuit included all of the signals, then the procedure advances to step SA07, and if not, then the procedure advances to step SA11.
[Step SA07] A search logic presence determination process, which is described below, is executed in respect of the ladder circuit data extracted in step SA04, and a search is made to identify whether the ladder circuit includes all of the search logic of the signals which are the search objects.
[Step SA08] It is determined whether or not the ladder circuit included all of the search logics of the signals that are the search objects, in the search logic presence determination process executed in step SA07. If the circuit included all of the search logics, then the procedure advances to step SA09, and if not, then the procedure advances to step SA11.
[Step SA09] The value of the circuit pointer is stored in the search result table at the position indicated by the result pointer.
[Step SA10] The result pointer is incremented by one.
[Step SA11] The circuit pointer is incremented by one and the procedure returns to step SA03.
[Step SA12] The pointer values stored at the previous positions by the result pointer are all extracted from the search results table, and a list of the ladder circuits stored at the positions indicated by the pointer values is displayed on the screen, whereupon the present process terminates.

Figure 4:
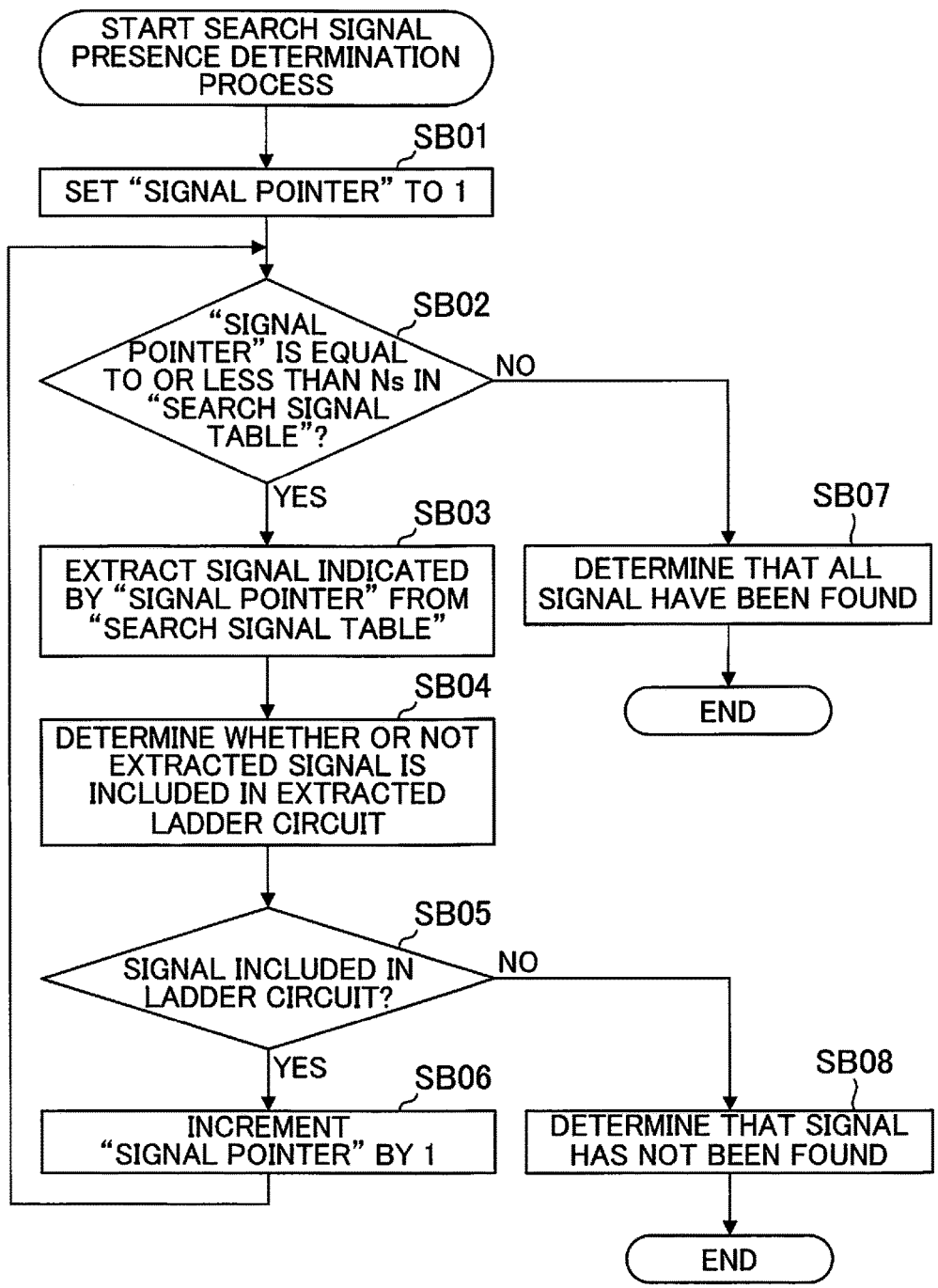
FIG. 4 is a general flowchart of a search signal presence determination process according to an embodiment of the present invention.

FIG. 4 is a general flowchart of a search signal presence determination process which is executed in step SA05 of the flowchart in FIG. 3.

[Step SB01] The signal pointer is set to 1.
[Step SB02] It is determined whether or not there is a remaining search signal that has not been retrieved, in other words, whether or not the signal pointer is equal to or lower than the number Ns of search signals stored in the search signal table. If the signal pointer is equal to or less than Ns, then the procedure advances to step SB03, and if not, then the procedure advances to step SB07.
[Step SB03] The search signal is acquired from the position indicated by the signal pointer in the search signal table.
[Step SB04] The ladder circuit which is the search object is retrieved using the search signal acquired at step SB03.
[Step SB05] It is determined whether or not the ladder circuit included the search signal, in step SB04. If the circuit included the signal, then the procedure advances to step SB06, and if not, then the procedure advances to step SB08.
[Step SB06] The signal pointer is incremented by one and the procedure returns to step SB02.
[Step SB07] It is determined that all of the search signals have been discovered, and the present process terminates.
[Step SB08] It is determined that the search signal has not been discovered, and the present process terminates.

Figure 5:
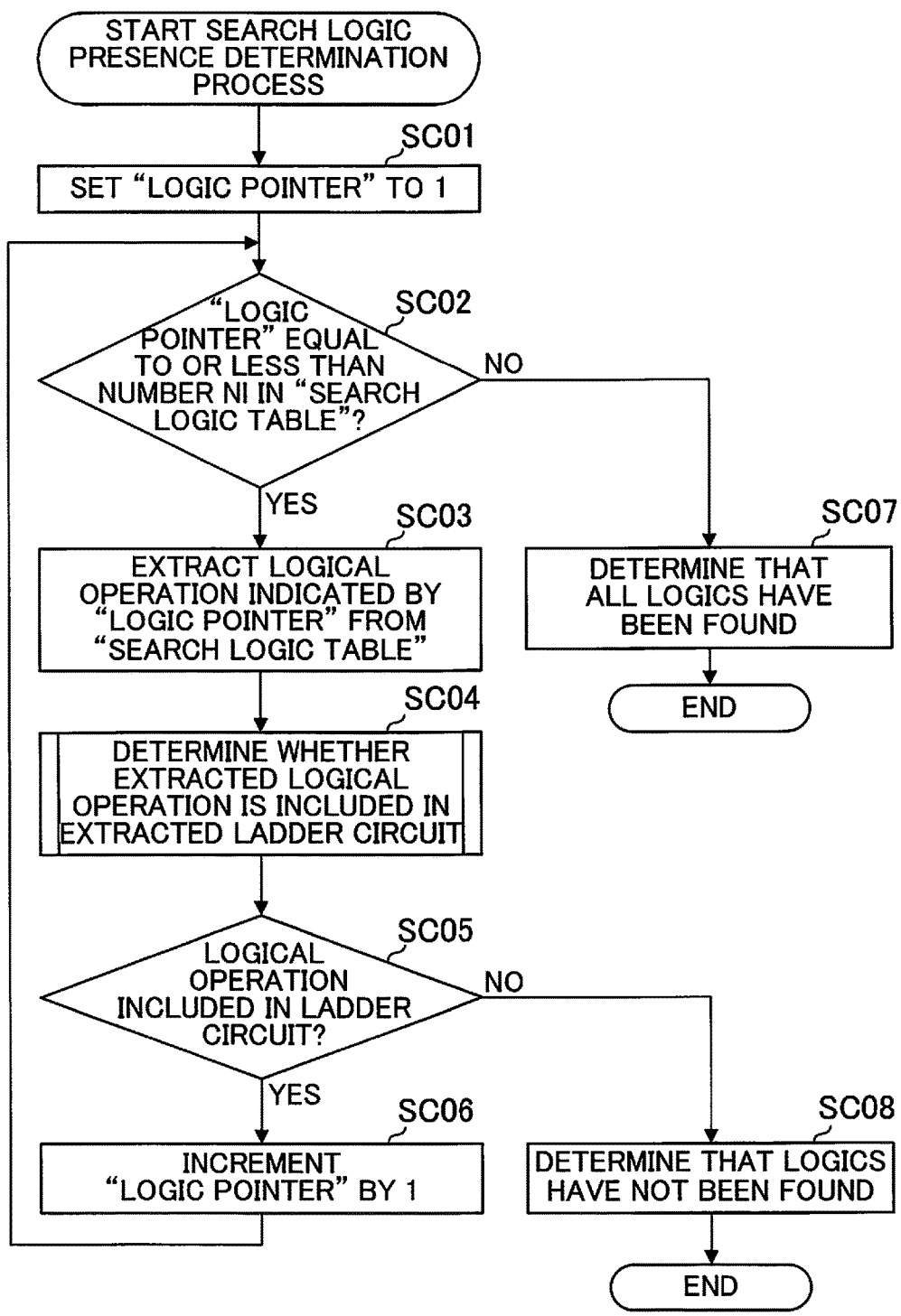
FIG. 5 is a general flowchart of a search logic presence determination process according to an embodiment of the present invention.

FIG. 5 is a general flowchart of a search logic presence determination process which is executed in step SA07 of the flowchart in FIG. 3.

[Step SC01] The logic pointer is set to 1.

[Step SC02] It is determined whether or not there is a remaining search logic that has not been retrieved, in other words, whether or not the logic pointer is equal to or lower than the number N1 of search logics stored in the search logic table. If the logic pointer is equal to or less than N1, then the procedure advances to step SC03, and if not, then the procedure advances to step SC07.

[Step SC03] The search logic is acquired from the position indicated by the logic pointer in the search logic table.

[Step SC04] The search logic matching determination process described below is carried out in respect of the search logic acquired in step SC03 and the ladder circuit that is the search object acquired from the program data.

[Step SC05] It is determined whether or not the ladder circuit included the search logic, in step SC04. If the circuit included the logic, then the procedure advances to step SC06, and if not, then the procedure advances to step SC08.

[Step SC06] The logic pointer is incremented by one and the procedure returns to step SC02.

[Step SC07] It is determined that all of the search logics have been discovered, and the present process terminates.

[Step SC08] It is determined that the search logic has not been discovered, and the present process terminates.

Of the processes described thus far, the process for determining whether or not a particular ladder circuit includes the specified search signal can be installed relatively easily, but the process for determining whether or not a particular ladder circuit includes a certain logical operation may give rise to problems if the determination is based on a comparison of the command sequence and/or ladder diagram patterns, as in the prior art. The reason for this is described here with reference to FIG. 6 and FIG. 7.

Figure 6:
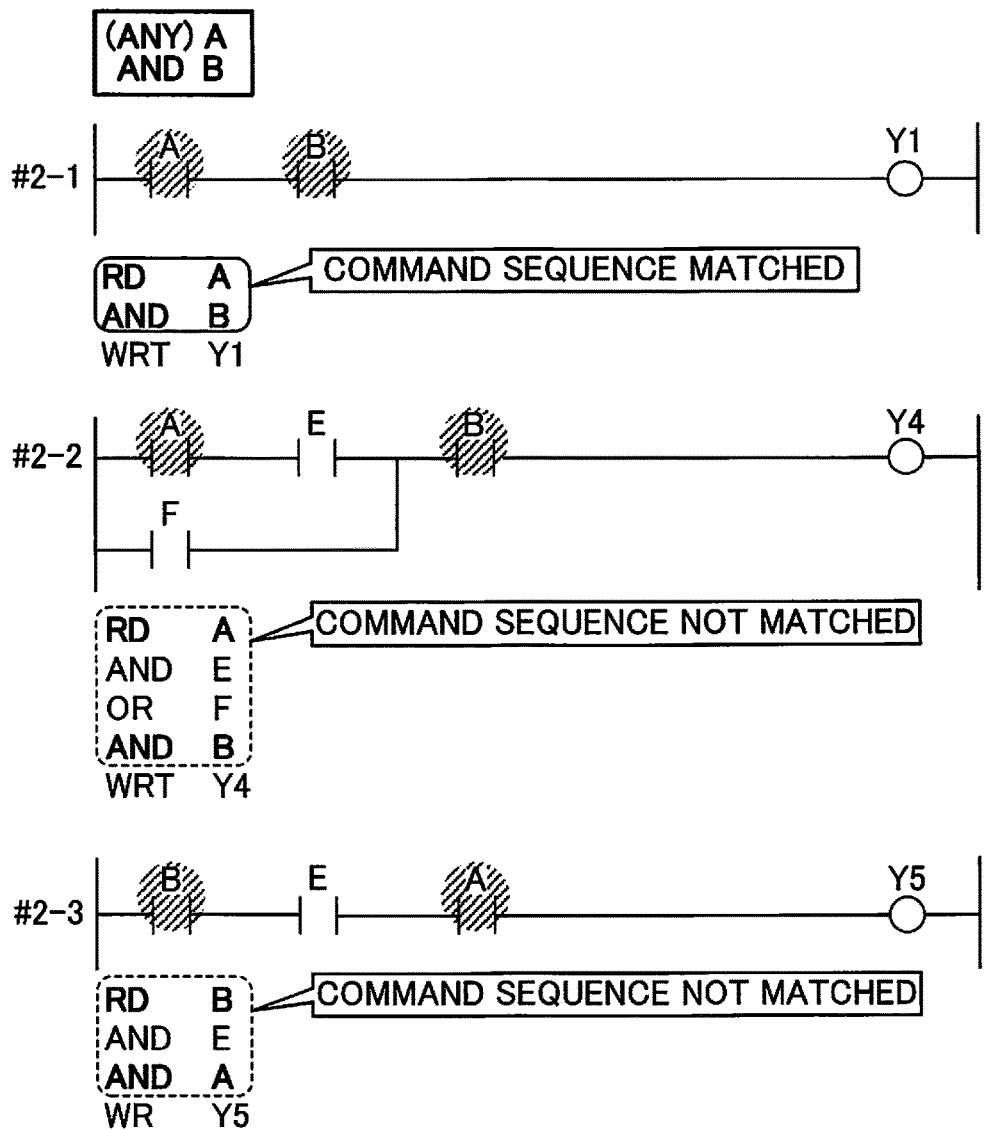
FIG. 6 is a diagram showing an example of retrieval of a ladder program based on a command sequence according to the prior art.
Figure 7:
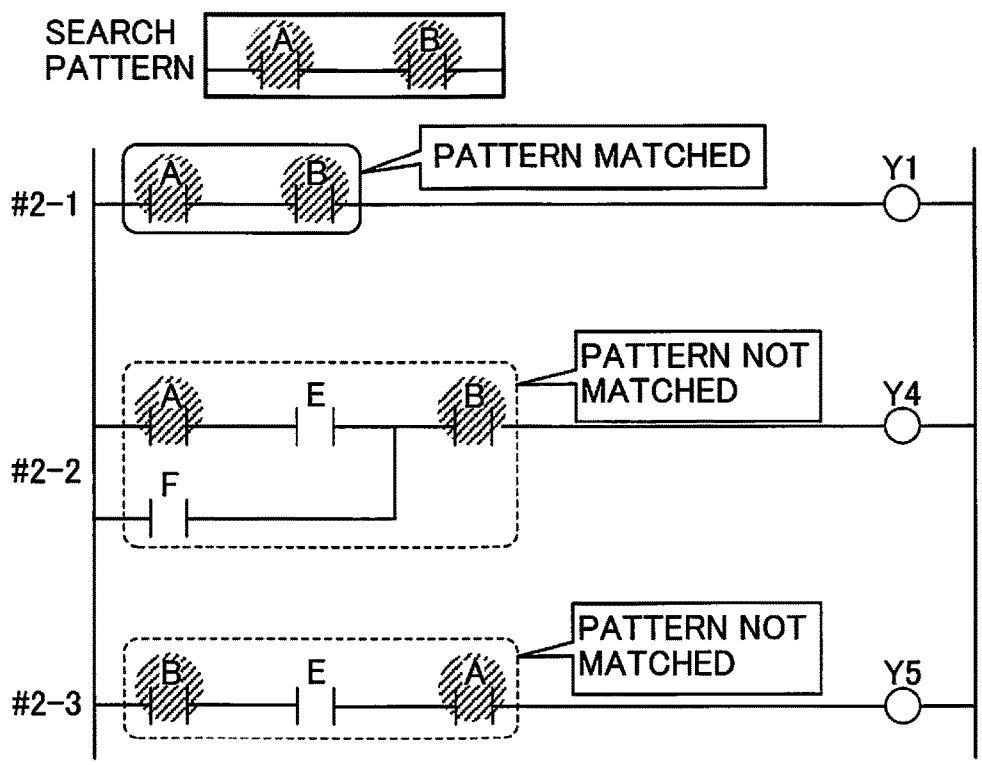
FIG. 7 is a diagram showing an example of retrieval of a ladder program based on a ladder diagram pattern according to the prior art.

In the case of a ladder circuit such as the ladder circuit #2-1 indicated in FIGS. 6 and 7, which partially includes the actual logical conjunction of signal A and signal B, then it is determined that the ladder circuit matches the search condition when using a conventional determination method based on matching of command sequences and/or ladder diagram patterns.

However, in actual ladder circuits, it is often the case that junctions representing additional conditions and/or exceptional conditions are appended, and there are many ladder circuits where, even if the logical conjunction of signal A and signal B is a condition for operation in a main rung, a logical operation with another junction is inserted, as in #2-2 and/or #2-3. In the case of ladder circuits such as #2-2 and/or #2-3, when viewed as a whole it can be seen that signal A and signal B are computed in the form of a logical conjunction, but due to the appearance of other junctions in the circuit, a problem arises in that the circuits would be determined to be "not matching" by retrieval means based on matching of command sequences and/or ladder diagram patterns.

Therefore, if ladder circuits are retrieved using match determination based on command sequences and/or ladder circuit patterns as in the prior art, then although #2-1 can be determined to be matching, ladder circuits which include further conditions for operation, such as #2-2 and #2-3, are determined to be "not matching" by retrieval means based on matching of command sequences and/or ladder diagram patterns, due to the presence of other junctions that are introduced therein.

Therefore, in the present invention, a search logic match determination process is introduced to determine matching while excluding the effects of other junctions, by determining the logical connection relationship between two junctions of interest from the positional relationship of the two junctions. There are several possible methods for the search logic match determination process.

Examples of search logic match determination processes using a ladder circuit simplification process are explained here with reference to FIGS. 8A, B and C. In a search logic match determination process using a ladder circuit simplification process, it is determined whether or not a ladder circuit includes the search logic (A and B), by the following procedure.

[Step 1] Signal A and signal B are respectively selected, once each, in the ladder circuit. If the same signal appears multiple times, then steps 2 to 4 below are carried out for all combinations thereof.

[Step 2] Steps 2-1 to 2-3 below are repeated for all of the signals apart from the signal A and the signal B that have been selected, to achieve a state where only the signal A and the signal B are remaining in the circuit.

[Step 2-1] Junctions aligned directly in series with another next adjacent junction and/or partial circuit are substituted with a connecting line.

[Step 2-2] Junctions aligned directly in parallel with another next adjacent junction and/or partial circuit are deleted.

[Step 2-3] Write coils are deleted.

[Step 3] The remaining connecting lines are removed from the circuit in which all signals apart from the selected signal A and signal B have been erased, to shape the circuit to a simplified ladder circuit format.

[Step 4] After shaping the circuit, the connection mode of the signal A and signal B (logical conjunction, logical sum) is identified and matching or non-matching with the search logic is determined.

Figure 9:
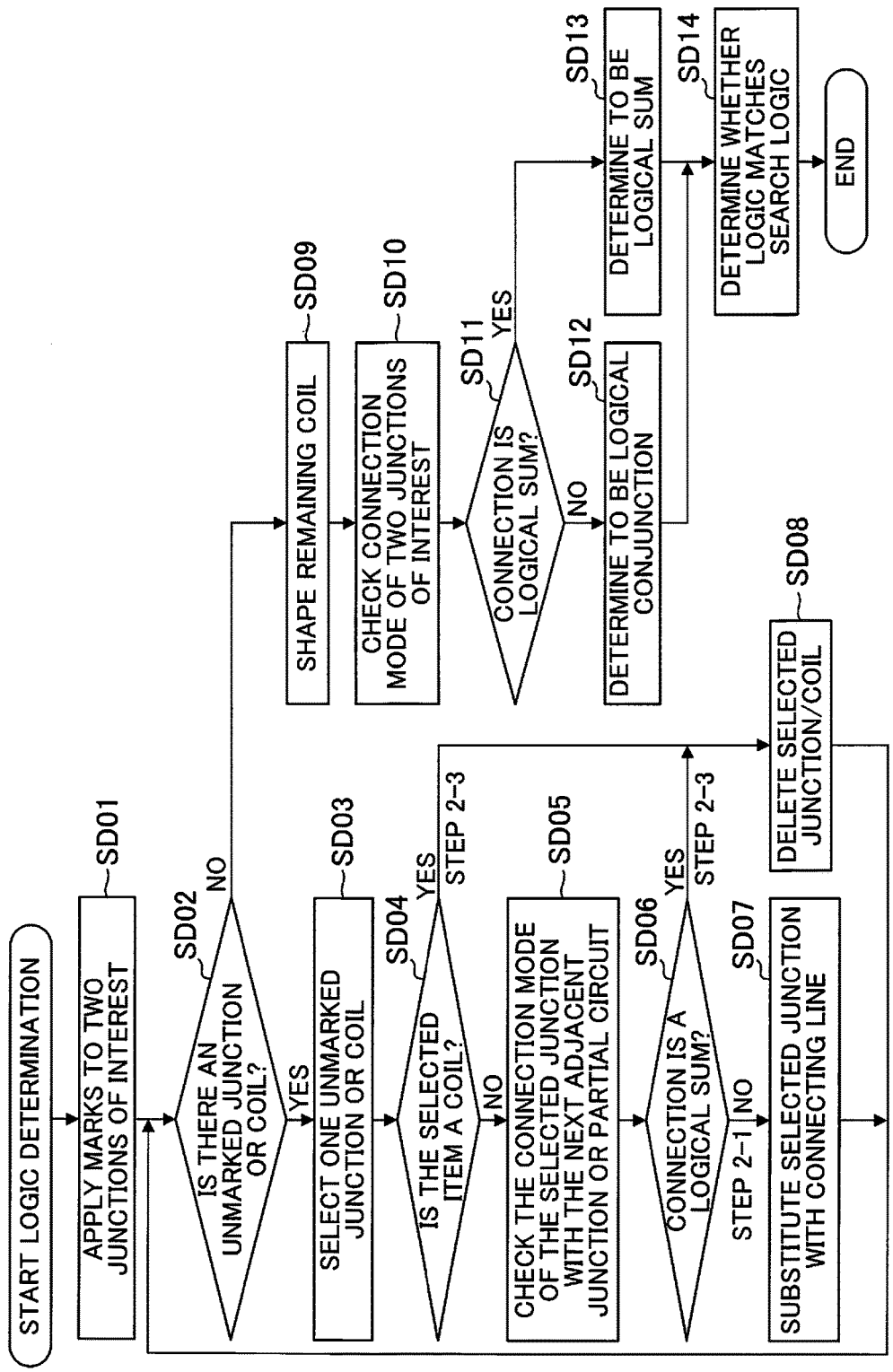
FIG. 9 is a general flowchart of a search logic matching determination process using ladder circuit simplification according to an embodiment of the present invention.

FIG. 9 shows a general flowchart of a search logic matching determination process using a simplification process by which these steps are executed in a device. [Step SD01] Marks (flags, etc. provided in a memory) are applied to the two junctions of interest, among the junctions included in the ladder circuit data.

[Step SD02] It is determined whether or not there are any remaining junctions or coils which are unmarked, in the ladder circuit data. If there are remaining junctions or coils which are unmarked, then the procedure advances to step SD03, and if there is no remaining junction or coil, then the procedure advances to step SD09.

[Step SD03] An unmarked junction or coil is selected from the ladder circuit data.

[Step SD04] It is determined whether or not the item selected in step SD03 is a coil. If the item is a coil, then the procedure advances to step SD08, and if the item is not a coil, then the procedure advances to step SD05.

[Step SD05] The mode of connection between the junction selected in step SD03 and the next adjacent junction or partial circuit is confirmed.

[Step SD06] It is determined whether or not the connection mode checked in step SD05 is a logical sum. If the connection mode is a logical sum, then the procedure advances to step SD08, and if not, then the procedure advances to step SD07.

[Step SD07] The junction selected in step SD03 is substituted with a connecting line.

[Step SD08] The junction or coil selected in step SD03 is deleted.

[Step SD09] The circuit in which only the two marked junctions are remaining is shaped by ordering the spare connecting lines.

[Step SD10] The connection mode between the two marked junctions is checked.

[Step SD11] It is determined whether or not the connection mode checked in step SD11 is a logical sum. If the connection mode is a logical sum, then the procedure advances to step SD13, and if not, then the procedure advances to step SD12.

[Step SD12] It is determined that the two junctions of interest are a logical conjunction.

[Step SD13] It is determined that the two junctions of interest are a logical sum.

[Step SD14] Matching or non-matching with the search logic is determined on the basis of the results determined in steps SD12 and SD13, whereupon the present process terminates.

FIGS. 10 and 11 show concrete examples of a search logic match determination process using this simplification process.

For example, supposing that the search logic is (A and B), then when determining whether the search logic is included in the ladder circuit #2-2 shown in FIG. 10, a simplification process focused on signal A and signal B is executed in accordance with the procedure described above.

Initially, looking at junction E, which is a junction other than the signal A and signal B which are the focus of interest, this junction E is a junction which is connected in series to the next adjacent junction A, and therefore step 2-1 applies and junction E is substituted with a connecting line. Next, looking at junction F, since the junction is connected in parallel with the next adjacent junction A, step 2-2 applies and junction F is deleted. Moreover, in the case of coil Y4, step 2-3 applies, and coil Y4 is deleted.

Finally, the ladder circuit is shaped by ordering the spare connecting lines, and by determining the connection mode between signal A and signal B, it can be determined that the ladder circuit #2-2 includes the search logic (A and B).

Furthermore, consideration is also given to a case where it is determined in the ladder circuit #2-4 shown in FIG. 11 includes the search logic, when it is supposed that the search logic is (A and B).

Initially, looking at junction C, which is a junction other than the signal A and signal B which are the focus of interest, this junction C is connected in parallel with the next adjacent junction D, and therefore step 2-2 applies and junction C is deleted. Next, looking at junction D, since this junction is connected in series with a next adjacent partial circuit (junction A, junction B), then step 2-1 applies and junction D is substituted with a connecting line.

Finally, the ladder circuit is shaped by ordering the spare connecting lines, and when determining the connection mode between signal A and signal B, it can be determined that in the ladder circuit #2-4, signal A and signal B are connected by a logical sum, and therefore it can be determined that this logical circuit #2-4 does not include the search logic (A and B).

In this way, when the logic is determined in the form of the ladder circuit after carrying out the simplification process, there is no need to take the positions of the two signals in the circuit, or the other junctions, into consideration, and an accurate matching determination can be made.

By using a determination method of this kind, it is possible to remove only ladder circuits such as the ladder circuit #2-4 shown in FIG. 11 from the search results, without determining that the ladder circuit #2-1, the ladder circuit #2-2 and the ladder circuit #2-3 shown in FIGS. 6 and 7 are non-matching in respect of the search logic (A and B).

The simplification technique indicated here is merely one example and apart from this it is also possible to use a calculation tree in which the calculation procedure is represented by a list structure, and to determine the connection relationship between the signal A and the signal B in the ladder circuit from the positions, in the calculation tree, of the signal A and signal B, which are the focus of interest, and use the connection relationship to determine matching.

FIG. 12 is an example in which the ladder circuit #2-2 is represented as a calculation tree which represents this logical operation. The ladder circuit #2-2 can be represented by the logic formula Y4=((A and E) or F) and B), and therefore can be represented as the calculation tree which is depicted in the lower part of the drawing.

When a circuit is represented as a calculation tree in this way, as shown in FIG. 13, it is possible to determine the connection relationship between the two junctions of interest, at the node which merges to the upper side respectively from the nodes corresponding to the two junctions of interest, and a search logic match determination process can be performed on the basis of the determined connection relationship.

An embodiment of the present invention was described above, but the present invention can also be implemented in other modes, by applying suitable modifications, without being limited to the examples in the embodiments mentioned above.

For example, when search conditions including negative logic are specified, then a fuzzy search may be specified, and a determination may be made such that a signal included in the search conditions matches both a signal to which the negative logic is not applied and a signal to which the negative logic is applied. By applying a function of this kind, a fuzzy search is made in respect of the search condition of the negative logic "A and (not B)", for example, and it is possible to retrieve/extract ladder circuits including both "A and (not B)" and "(not A) or B".

What is claimed is:

1. A ladder program retrieval device which retrieves a plurality of ladder circuits included in a ladder program on the basis of specified search conditions, the device comprising:
  a search condition specification unit for specifying, as search conditions,
    at least two signals from among a plurality of signals, and
    at least one logical operation relationship between the at least two signals included in the plurality of signals;
  a search signal presence determination unit for determining, for each of the plurality of ladder circuits included in the ladder program, whether the ladder circuit includes all of the at least two signals specified in the search conditions;
  a search logic presence determination unit for determining, for each of the ladder circuits determined by the search signal presence determination unit to include all of the at least two signals specified in the search conditions, whether or not the ladder circuit includes the at least one logical operation relationship specified in the search conditions; and
  a display unit for displaying the ladder circuits determined to have matched the search conditions by the search signal presence determination unit and the search logic presence determination unit, wherein the search logic presence determination unit is provided with a determination unit for determining a connection relationship in the ladder circuit between the at least two signals included in the at least one logical operation relationship on the basis of a positional relationship between the at least two signals included in the at least one logical operation relationship in the case where effects by all signals other than the at least two signals included in the at least one logical operation relationship are excluded, and determines whether or not the ladder circuit includes the at least one logical operation relationship on the basis of the determination result of the determination unit.

2. The ladder program retrieval device according to claim 1, wherein the determination unit generates a simplified ladder circuit by deleting, from the ladder circuit, the signals other than the at least two signals included in the at least one logical operation relationship, and determines the connection relationship in the ladder circuit between the at least two signals included in the at least one logical operation relationship, on the basis of the simplified ladder circuit.

3. The ladder program retrieval device according to claim 1, wherein the determination unit generates a calculation tree from the ladder circuit, and determines the connection relationship in the ladder circuit between the at least two signals included in the at least one logical operation relationship on the basis of the calculation tree.

4. The ladder program retrieval device according to claim 1, further comprising a search mode retrieval unit for selecting a fuzzy search mode, wherein, when the fuzzy search mode is selected by the search mode retrieval unit, the search logic presence determination unit makes a determination such that a signal among the at least two signals included in the at least one logical operation relationship matches both a signal to which negative logic is not applied and a signal to which negative logic is applied.

* * * * *